(12) United States Patent
Mann et al.

(10) Patent No.: US 12,055,654 B2
(45) Date of Patent: Aug. 6, 2024

(54) SCANNING RADAR SYSTEM WITH SUBSTRATE INTEGRATED WAVEGUIDES AND HEAT DISSIPATING STRUCTURES

(71) Applicant: GM Cruise Holdings LLC, San Francisco, CA (US)

(72) Inventors: -Ing. Sebastian Mann, Munich (DE); Andre Giere, Oberpframmern (DE); Richard Johann Körber, Hallerndorf (DE); Benedikt Hubertus Schulte, Neubiberg (DE)

(73) Assignee: GM CRUISE HOLDINGS LLC, San Francisco, CA (US)

( * ) Notice: Subject to any disclaimer, the term of this patent is extended or adjusted under 35 U.S.C. 154(b) by 319 days.

(21) Appl. No.: 17/407,797

(22) Filed: Aug. 20, 2021

(65) Prior Publication Data
US 2023/0059342 A1 Feb. 23, 2023

(30) Foreign Application Priority Data
Aug. 20, 2021 (EP) ..................................... 21192279

(51) Int. Cl.
*G01S 7/32* (2006.01)
*G01S 7/03* (2006.01)
(Continued)

(52) U.S. Cl.
CPC ............ *G01S 7/032* (2013.01); *G01S 13/426* (2013.01); *H05K 1/0218* (2013.01); *H05K 1/03* (2013.01); *H05K 1/115* (2013.01); *H05K 9/0024* (2013.01)

(58) Field of Classification Search
CPC .......... G01S 7/032; G01S 13/426; G01S 7/03; G01S 13/66; G01S 13/00; H05K 1/0218;
(Continued)

(56) References Cited

U.S. PATENT DOCUMENTS

2011/0140801 A1 6/2011 Shimura et al.
2012/0242427 A1 9/2012 Suzuki
(Continued)

FOREIGN PATENT DOCUMENTS

EP 4138215 A1 2/2023

OTHER PUBLICATIONS

Design of a Monopulse Antenna Using a Dual V-Type Linearly Tapered Slot Antenna (DVLTSA) Yu Jian Cheng, Student Member, IEEE, Wei Hong, Senior Member, IEEE, and Ke Wu, Fellow, IEEE IEEE Transactions on Antennas and Propagation, vol. 56, No. 9, Sep. 2008 (Year: 2008).*

(Continued)

*Primary Examiner* — Vladimir Magloire
*Assistant Examiner* — Remash R Guyah
(74) *Attorney, Agent, or Firm* — Calfee, Halter & Griswold LLP

(57) ABSTRACT

A radar system is described herein. The radar system includes a printed circuit board (PCB) that includes a metallized top layer and a substrate layer that is adjacent the metallized top layer. The substrate layer includes a substrate integrated waveguide (SIW), and the metallized layer has a slotted taper etched therein. The slotted taper is positioned relative to the SIW such that an electromagnetic signal generated by a monolithic microwave integrated circuit (MMIC) passes from the slotted taper to the SIW without an intervening microstrip line. The radar system further includes a housing that acts both to disperse heat and to suppress undesired electromagnetic radiation.

20 Claims, 9 Drawing Sheets

(51) Int. Cl.
    *G01S 13/42*   (2006.01)
    *H05K 1/02*    (2006.01)
    *H05K 1/03*    (2006.01)
    *H05K 1/11*    (2006.01)
    *H05K 9/00*    (2006.01)

(58) Field of Classification Search
    CPC ........ H05K 1/03; H05K 1/115; H05K 9/0024; H05K 1/0236; H05K 1/0213; H05K 1/0201; H05K 1/11; H05K 9/0029; H05K 9/0031
    USPC .......................................................... 342/175
    See application file for complete search history.

(56) References Cited

U.S. PATENT DOCUMENTS

| 2016/0218420 | A1 | 7/2016 | Leung et al. |
| 2017/0003377 | A1 | 1/2017 | Menge |
| 2019/0115643 | A1* | 4/2019 | Khan ........................ H01Q 9/42 |
| 2020/0211987 | A1* | 7/2020 | Kitt ........................ H05K 1/144 |
| 2020/0321710 | A1 | 10/2020 | Shtrom et al. |
| 2020/0350670 | A1* | 11/2020 | Beer ........................ G01S 7/027 |

OTHER PUBLICATIONS

"Extended European Search Report for European Patent Application No. 21192279.4", Mailed Date: Feb. 15, 2022, 10 pages.

"Response to the Extended European Search Report for European Patent Application No. 21192279.4", Filed Date: Jul. 27, 2023, pages.

Office Action for European Application No. 21192279.4, dated May 10, 2024, 7 pages.

* cited by examiner

SCANNING RADAR SYSTEM WITH SUBSTRATE INTEGRATED WAVEGUIDES AND HEAT DISSIPATING STRUCTURES

RELATED APPLICATION

This application claims priority to European Patent Application No. EP21192279.4, filed on Aug. 20, 2021, and entitled "SCANNING RADAR SYSTEM WITH SUBSTRATE INTEGRATED WAVEGUIDES AND HEAT DISSIPATING STRUCTURES". The entirety of this application is incorporated herein by reference.

BACKGROUND

Two-dimensional scanning radar systems include several Rx and Tx antennas that are placed on a surface of a printed circuit board (PCB), where the Rx and Tx antennas are positioned relative to one another to cause the radar system to perform according to predefined specifications. As two-dimensional scanning radar systems are employed in new applications, different performance requirements for such radar systems have arisen. In an example, two-dimensional scanning radar systems are being employed in autonomous vehicles (AVs), where the AVs autonomously navigate roadways based upon outputs of the two-dimensional scanning radar systems.

As noted above, a conventional two-dimensional scanning radar system includes several Rx and Tx patch antennas, and these antennas consume a relatively large amount of space on a surface of a PCB. In addition, the conventional radar system includes several monolithic microwave integrated circuits (MMICs) that drive the Tx antennas and that process electromagnetic signals detected by the Rx antennas. These MMICs consume space on the PCB of the radar system, and additionally generate heat. Furthermore, due to mechanical designs of existing scanning radar systems, such systems may emit undesired and/or parasitic radiation into the environment, thereby negatively affecting operation of the radar systems.

SUMMARY

The following is a brief summary of subject matter that is described in greater detail herein. This summary is not intended to be limiting as to scope of the claims.

Described herein are various technologies relating to a two-dimensional scanning radar system that is designed to allow componentry of the radar system to reside in a relatively small space. In addition, the radar system is designed to dissipate heat relatively uniformly without impacting a field of view (FOV) of the radar system. Moreover, the radar system is designed to have a relatively low profile, such that the radar system can be readily positioned on an automobile. Finally, the radar system is designed to suppress undesirable electromagnetic emissions from MMICs and other componentry of the radar system.

With more particularity, a two-dimensional scanning radar system is described herein that includes multiple MMICs, multiple Rx antennas, and multiple Tx antennas. For instance, each MMIC may be coupled to an Rx antenna and a Tx antenna. In another example, each MMIC may be coupled to several Rx antennas and a single Tx antenna. In conventional radar systems, an MMIC is electromagnetically coupled to an antenna by a two-step transition: 1) from the MMIC to a microstrip line (MSL), and 2) from the MSL to a substrate integrated waveguide (SIW). In contrast, in the radar system described herein, no MSL transition is used to electromagnetically couple the MMIC to the SIW. Instead, a slotted taper is etched into a metal layer of a printed circuit board (PCB) upon which the MMIC is mounted. An electromagnetic signal emitted from the MMIC is transformed into waveguide mode by the slotted taper, and then is directed from the slotted taper to a SIW. This approach results in saving a significant amount of space on the surface of the PCB, as MSLs have lengths of several millimeters.

In addition, structures are implemented in the PCB (collectively referred to as an inductive blend) to facilitate matching impedance of the slotted taper to the impedance of the SIW, thereby enhancing ability of an electromagnetic signal to pass from the slotted taper to the SIW. These structures include metallized vias that are coupled to ground, where the metalized vias are positioned inside the SIW and are positioned at a defined position from the taper. The structures result in out-of-band frequencies in the electromagnetic signal being suppressed. More specifically, the SIW acts as a high-pass filter, having a frequency cutoff of, for example, approximately 50 GHz. The inductive blend acts to suppress out-of-band interferers that are above the frequency cutoff of the SIW (e.g., filter signals outside of a 71 GHz to 80 GHz band).

The radar system further includes heat dissipating elements that are configured to dissipate heat generated by MMICs and other componentry mounted on the PCB. The radar system includes a low profile thermally conductive housing (sometimes referred to as a mask), which acts as a heat pipe and additionally suppresses emission of undesirable electromagnetic signals. Further, due at least in part to the lack of microstrip lines between the MMICs and SIWs, the PCB can include cutouts that extend through the PCB, where thermally conductive heat stamps are used to transfer heat from the low-profile housing to a heat spreader that is placed on a backside of the PCB.

Still further, the radar system is designed to suppress out-of-band interferers; for example, the low-profile housing can suppress undesirable emissions from the MMICs, as the housing can be placed directly above the MMICs. In addition, the radar system can include electromagnetic interference (EMI) foams or other EMI countermeasures to further suppress undesired electromagnetic emissions. suppression The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
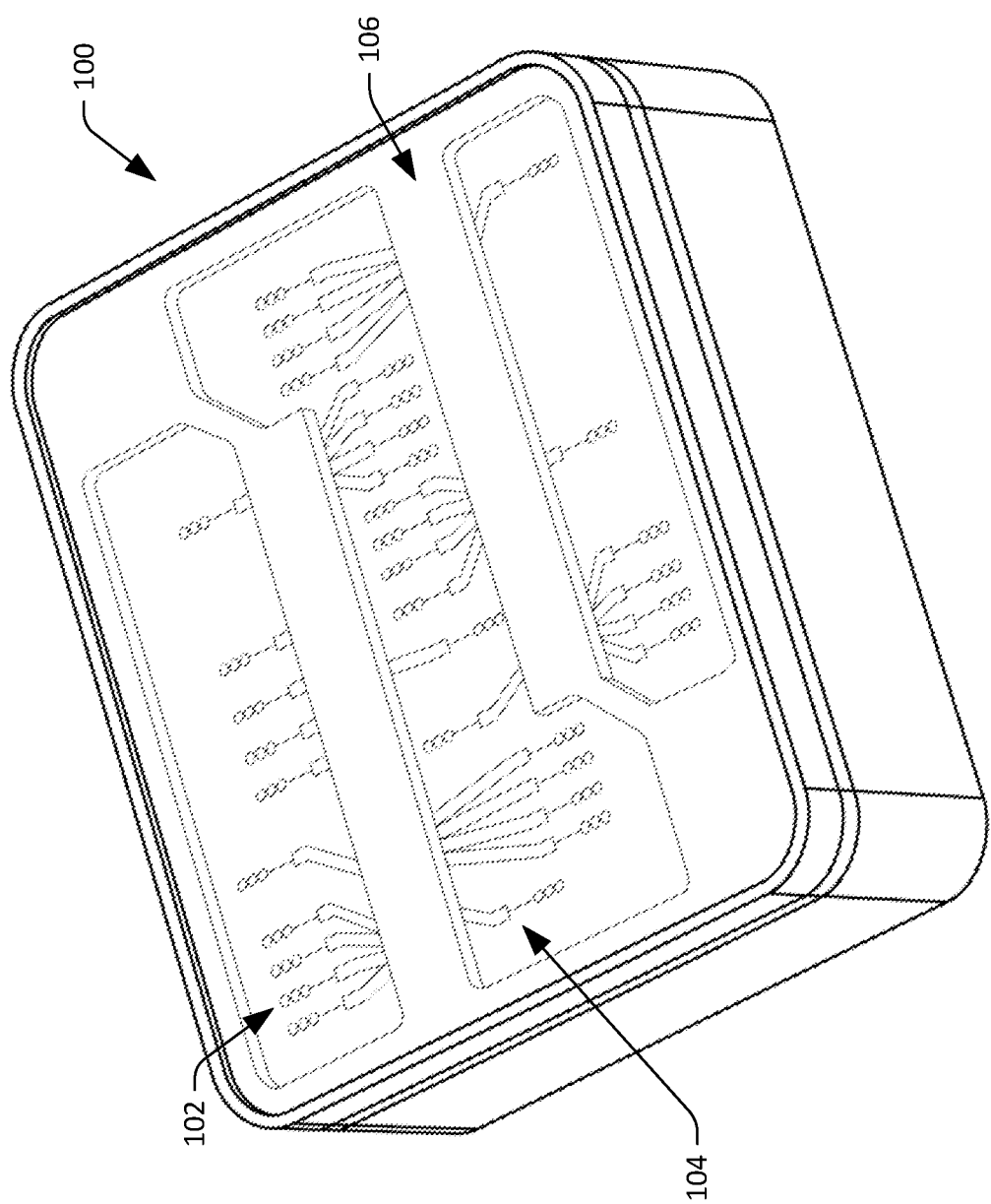
FIG. 1 is an isometric view of a two-dimensional scanning radar system.

Various technologies pertaining to a two-dimensional scanning radar system are now described with reference to the drawings, where like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system modules may be performed by multiple modules. Similarly, for instance, a module may be configured to perform functionality that is described as being carried out by multiple modules.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances. X employs A; X employs B; or X employs both A and B. In addition, the articles "a" and "an" as used in this application and the appended claims should generally be construed to mean "one or more" unless specified otherwise or clear from the context to be directed to a singular form.

A two-dimensional scanning radar system is described herein, where the radar system includes structures that facilitate the radar system having a compact size, that further facilitate dissipation of heat generated by componentry of the radar system, and still further facilitate suppression of undesirable electromagnetic emissions from the radar system. In an aspect described in greater detail herein, some of such structures include slotted tapers and substrate integrated waveguides (SIWs), where electromagnetic signals transition directly from the slotted tapers to the SIWs without intervening microstrip lines (MSLs) therebetween. This arrangement is in contrast to conventional approaches, where electromagnetic signals transition from monolithic microwave integrated circuits (MMICs) MSLs, and then from MSLs to SIWs. Other technologies will be described in greater detail herein.

Referring now to FIG. 1, an isometric view of a two-dimensional scanning radar system 100 is illustrated. The radar system 100 includes numerous antennas that are arranged planarly and that are electromagnetically coupled to MMICs. In an example embodiment, the radar system 100 includes seven MMICs, although a radar system may include fewer or more MMICs than seven. As illustrated, each MMIC has one transmitting (Tx) antenna and four receiving (Rx) antennas electromagnetically coupled thereto. For instance, four Rx antennas 102 and one Tx antenna 104 are electromagnetically coupled to a single MMIC. Again, it is understood that an MMIC may have only Tx antennas electromagnetically coupled thereto, only Rx antennas electromagnetically coupled thereto, or different numbers of Rx and Tx antennas electromagnetically coupled thereto.

The radar system 100 includes a low-profile housing 106 that acts to dissipate heat generated by componentry of the radar system 100, and additionally acts to suppress unwanted electromagnetic emissions from MMICs that are underneath the housing 106. The housing 106 includes cutouts where the antennas are positioned, such that the housing 106 does not interfere with a field of view (FOV) of the radar system 100. In an example, the antennas are positioned in accordance with an optimized design, in order to provide desired performance of the radar system 100 (e.g., for example, a FOV of +/−60 degrees). The housing 106 is constructed of a thermally conducting material, such as Aluminum.

The radar system 100, while not illustrated in FIG. 1, includes a printed circuit board (PCB) upon which the MMICs and antennas are mounted. The PCB includes a metal top layer (where the MMICs are mounted on the metal top layer), a substrate layer immediately beneath the metal top layer (where the antennas are mounted on the substrate layer), and a ground layer positioned beneath the substrate layer. As will be described in greater detail herein, the MMICs are electromagnetically coupled to the antennas (including the Rx antennas 102 and the Tx antenna 104) by way of electromagnetic paths that include slotted tapers and SIWs without MSLs positioned between the tapered slots and the SIWs. This arrangement, in combination with other structures on the PCB, facilitates various advantages that will be described in greater detail below, including heat dissipation, suppression of electromagnetic signals that are out-of-band, amongst others.

Due at least in part to the relatively small size of the radar system 100, the radar system 100 can be advantageously used in an automotive setting. For example, an automobile may have a computing system thereon that receives data from the radar system 100, and the computing system can cause the automobile to perform one or more driving maneuvers, such as braking, making a turn, etc. For instance, the automobile may employ output of the radar system 100 to perform one or more driver-assistance functionalities, such as initiating a braking action if an obstacle is detected, maintaining the automobile in a lane, etc. In another example, an autonomous vehicle (AV) may include the radar system 100, wherein the AV performs autonomous driving maneuvers based upon output of the radar system 100. The radar system 100 may be placed at any suitable position on the AV; in an example, the radar system 100 is mounted on a roof of the AV.

Figure 2:
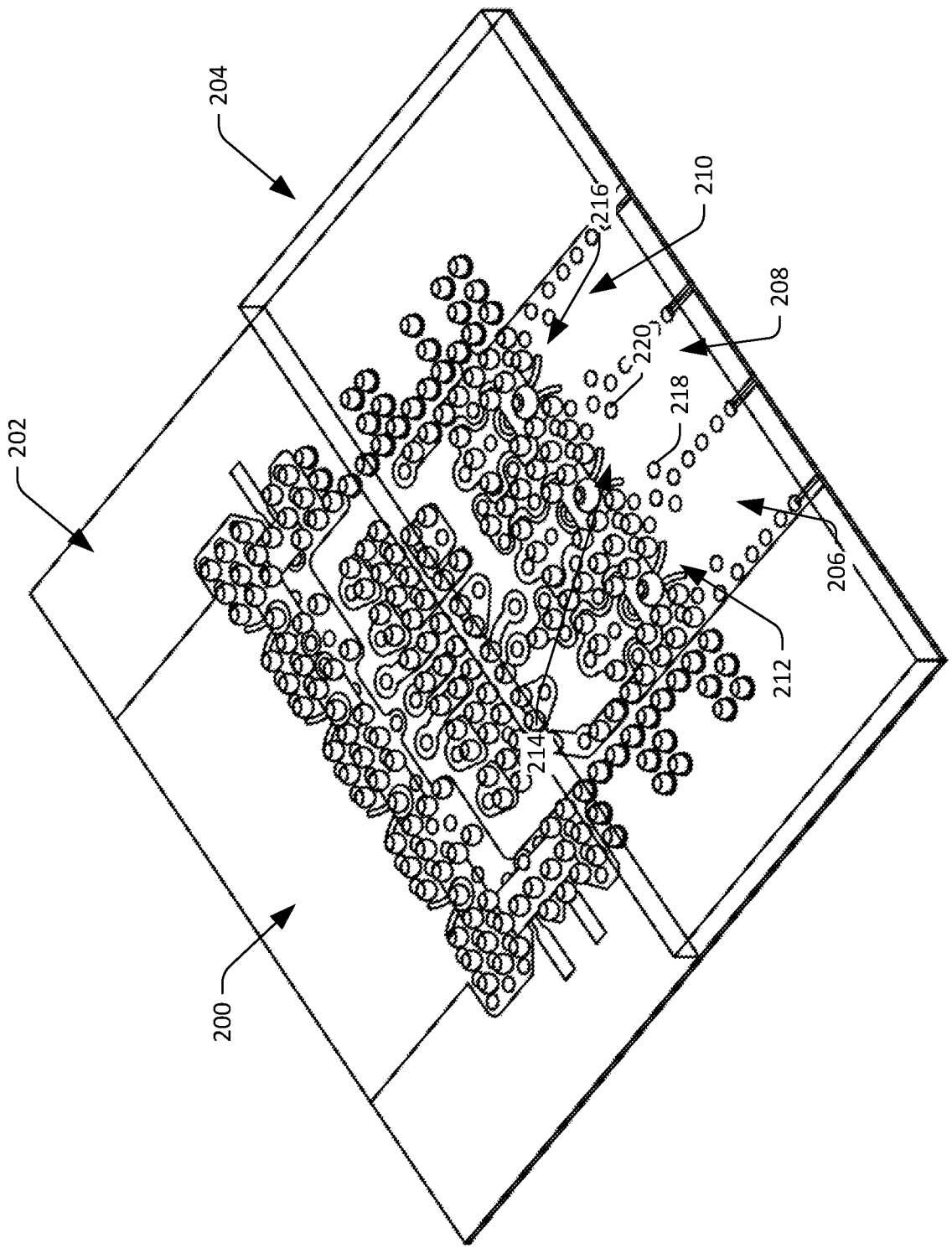
FIG. 2 is a view of a top side of a metal top layer of a printed circuit board (PCB), where the PCB is included in the radar system illustrated in FIG. 1.

Referring now to FIG. 2, a semi-transparent isometric view of a top metal layer 200 and substrate layer 202 of a PCB 204 included in the radar system 100 is depicted. The metal layer 200 can be formed of copper and includes solder balls that are used to electrically couple MMICs to the PCB 204.

The PCB 204 includes several SIWs that are electromagnetically coupled to an MMIC that is mounted to the metal layer 200 of the PCB 204; for purposes of explanation, reference numerals 206-210 refer to three SIWs in the PCB 204. It is to be understood, however, that the PCB 204 may include more or fewer than three SIWs for each MMIC that is mounted to the PCB 204.

The PCB 204 further includes three slotted tapers 212-216, where electromagnetic radiation passes between the MMIC and the SIWs 206-210 by way of the slotted tapers 212-216, respectively. The slotted tapers 212-216 are etched into the metal layer 200 of the PCB 204. In contrast to conventional approaches in radar systems, electromagnetic radiation passes directly between the slotted tapers 212-216 and the SIWs 206-210 without intervening MSLs. This design saves a significant amount of space on the PCB 204. As illustrated in FIG. 2, each SIW is electromagnetically coupled to the MMIC by way of two slotted tapers. It is to be understood, however, that more than two slotted tapers or fewer than two slotted tapers can be employed to electromagnetically couple a MMIC to a SIW.

The SIWs also include grounded vias that are employed to match impedances of the slotted tapers with impedances of the SIWs. For instance, the SIW 208 includes grounded vias 218 and 220 that are placed within the SIW 208, wherein the grounded vias 218 and 220 are positioned relative to the slotted tapers 214, relative to walls of the SIW 208, and relative to each other such that impedance of the slotted tapers 214 matches impedance of the SIW 208 proximate the junction of the slotted tapers 214 and the SIW 208. This arrangement (e.g., the inclusion of the grounded vias 218 and 220 in the SIW 208) results in an improvement in the transmission coefficient through the transmission path that includes the slotted tapers 214 and the SIW 208 compared to the transmission coefficient when the grounded vias 218-220 are not included in the SIW 208.

The structures depicted in FIG. 2 exhibit various advantages over conventional structures employed in two-dimensional scanning radar systems. For example, the SIWs 206-210 act as high-pass filters, such that electromagnetic radiation with a frequency that falls beneath a cutoff frequency of the SIWs 206-210 does not travel through the SIWs 206-210. In an example, the cutoff frequency of the SIWs 206-210 may be 50 GHz. The grounded vias 218-220 provide additional filtering, such that electromagnetic radiation within a particular band above the cutoff frequency of the SIW 208 is able to pass between the SIW 208 and the slotted tapers 214. In an example, the frequency band is between 70 GHz and 81 GHz, electromagnetic radiation of other frequencies is filtered.

Figure 3:
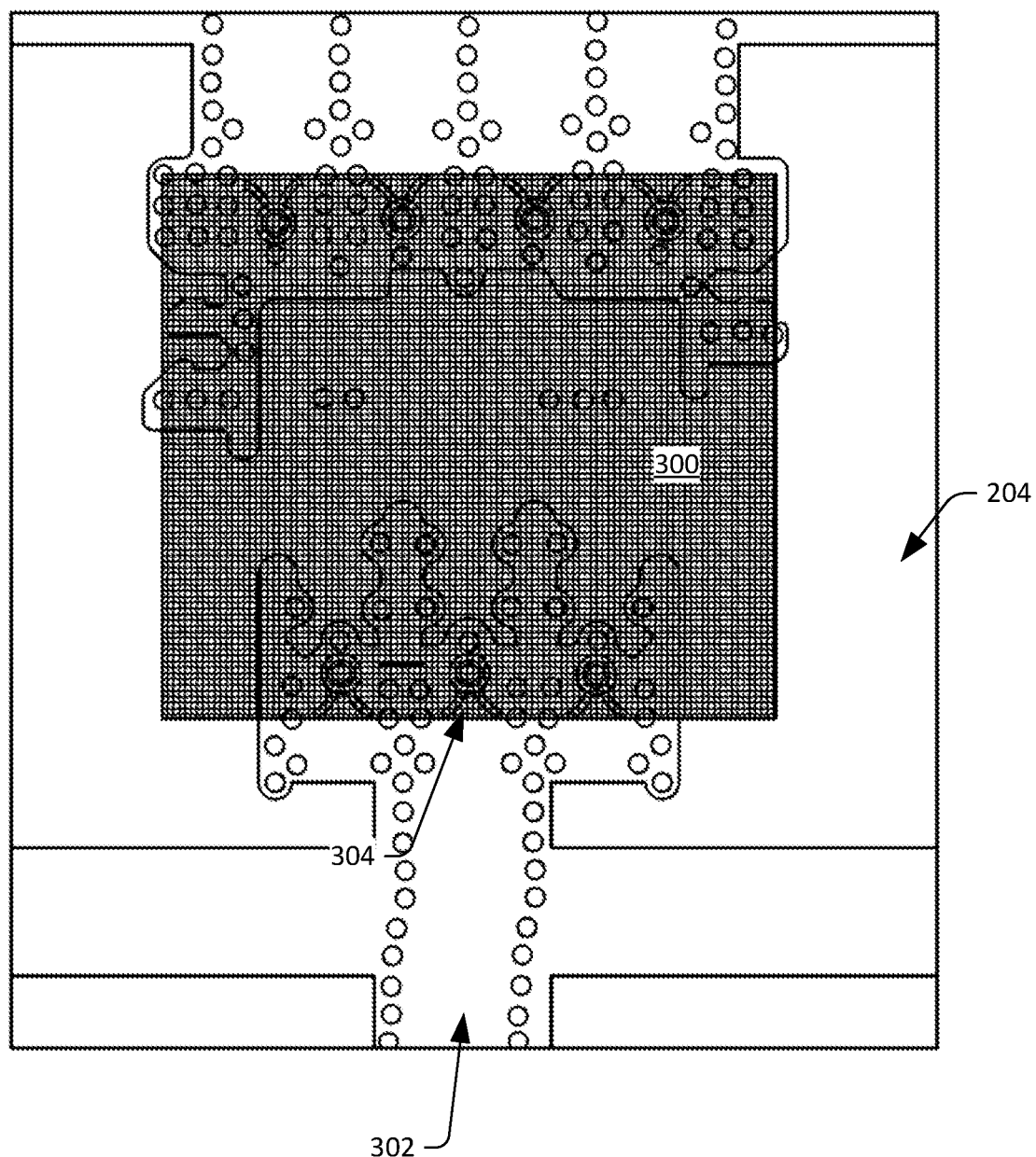
FIG. 3 is an overhead semi-transparent view of a monolithic microwave integrated circuit (MMIC) mounted to the metal top layer of the PCB, where substrate integrated waveguides (SIWs) that transport electromagnetic signals to and from the MMIC are depicted.

Now referring to FIG. 3, a semi-transparent overhead view of an MMIC 300 mounted on the PCB 204 is illustrated. The PCB 204 has a SIW 302 and a slotted taper 304 that is (directly) electromagnetically coupled to the SIW 302. As can be ascertained, the transition between the slotted taper 304 and the SIW 302 occurs underneath the MMIC 300, thereby saving space that in conventional designs is occupied by MSLs.

Figure 4:
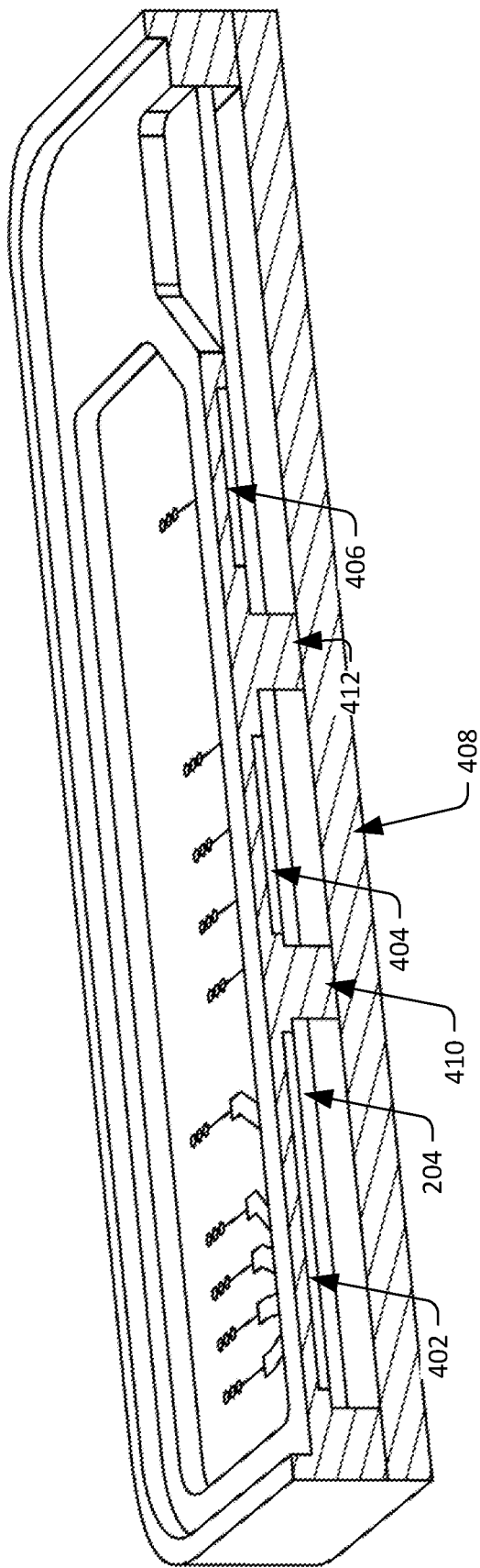
FIG. 4 is a cutaway view of a portion of the radar system of FIG. 1.

Turning now to FIG. 4, a cutaway view of a portion of the radar system 100 is illustrated. The radar system 100 includes several MMICs 402-406 that are mounted on the PCB 204. The radar system 100 further includes the housing 106, where the housing is mechanically coupled to the MMICs 402-406 by way of a heat paste (or other suitable thermally conductive material). The housing 106 covers the MMICs 402-406, but includes cutouts so that the housing 106 does not interfere with electromagnetic radiation emitted by the Tx antennas and/or electromagnetic radiation detected by the Rx antennas. Therefore, the housing 106 does not interfere with the field of view of the radar system 100.

The radar system 100 further includes a heat spreader 408 that is positioned on a backside of the PCB 204 (opposite the side of the PCB 204 where the MMICs 402-406 are mounted). The heat spreader 408 is mechanically coupled to the housing 106 by way of heat stamps 410 and 412 of the housing 106 that extend through the PCB 204. With more particularity, the PCB 204 includes cutouts between MMICs, and the heat stamps 410 and 412 are positioned in such cutouts and couple to the heat spreader 408. The heat stamps can also include mechanical fastening structures for connecting a radome to the housing 106, where the radome, when coupled to the housing 106, is at a desired distance from a top surface of the PCB 204. The mechanical fastening structures may be threaded apertures, such that the radome is coupled to the housing 106 by way of threaded fasteners (e.g., screws). In another example, the fastening structures may be dowels that extend through the heat stamps 410 and 412 and act as heat pipes. Other fastening structures are also contemplated.

The low-profile housing 106 additionally acts to suppress emission of undesired radiation from the MMICs 402-406. As illustrated in FIG. 4, the housing 106 covers the MMICs 402-406, thus suppressing electromagnetic radiation that does not enter the SIWs of the PCB 204. Accordingly, the housing 106 (in combination with the heat stamps 410 and 412) simultaneously addresses thermal issues and electromagnetic interference issues. The design of the housing 106 and heat stamps 410 and 412 is possible due to placement of the SIWs relative to the MMICs (with the slotted tapers positioned beneath the MMICs). Such topology allows for a direct, hermetically sealed attachment to the PCB 204. In addition, the radar system 100 can include electromagnetic interference foams or other electromagnetic interference countermeasures.

Still further, the radar system 100 optionally includes a signal generator that generates a local oscillator, where the signal generator is electrically coupled to each of the MMICs mounted on the PCB 204. Undesired electromagnetic emissions from interconnects between the signal generator and the MMICs can be suppressed using a variety of approaches. For instance, the local oscillator signal can be guided to an MMIC within a hermetic enclosure that encloses the MMIC. In another example, interconnects between the signal generator and one or more MMICs mounted on the PCB 204 can be placed within a substrate layer of the PCB 204. In yet another example, the signal generator can be mounted on a backside of the PCB, such that the signal generator and corresponding interconnects are entirely separated from the front surface and parasitic radiation is avoided.

During operation of the radar system 100, the MMICs 402-406 generate heat, where the heat travels from the MMIC through the thermally conductive material (such as a heat paste, sheets of thermally conductive material, etc.) to the housing 106. The heat disperses throughout the housing 106 and travels down the heat stamps 410 and 412 to the heat spreader 408. It is desirable to have equal heat distribution across all componentry (and particularly active devices such as MMICs) of the radar system 100 to guarantee comparable operation of Tx and Rx antennas of the radar system, and to further compensate for thermal nonlinear behavior (e.g., from power amplifiers, phase shifters, etc.).

Figure 5:
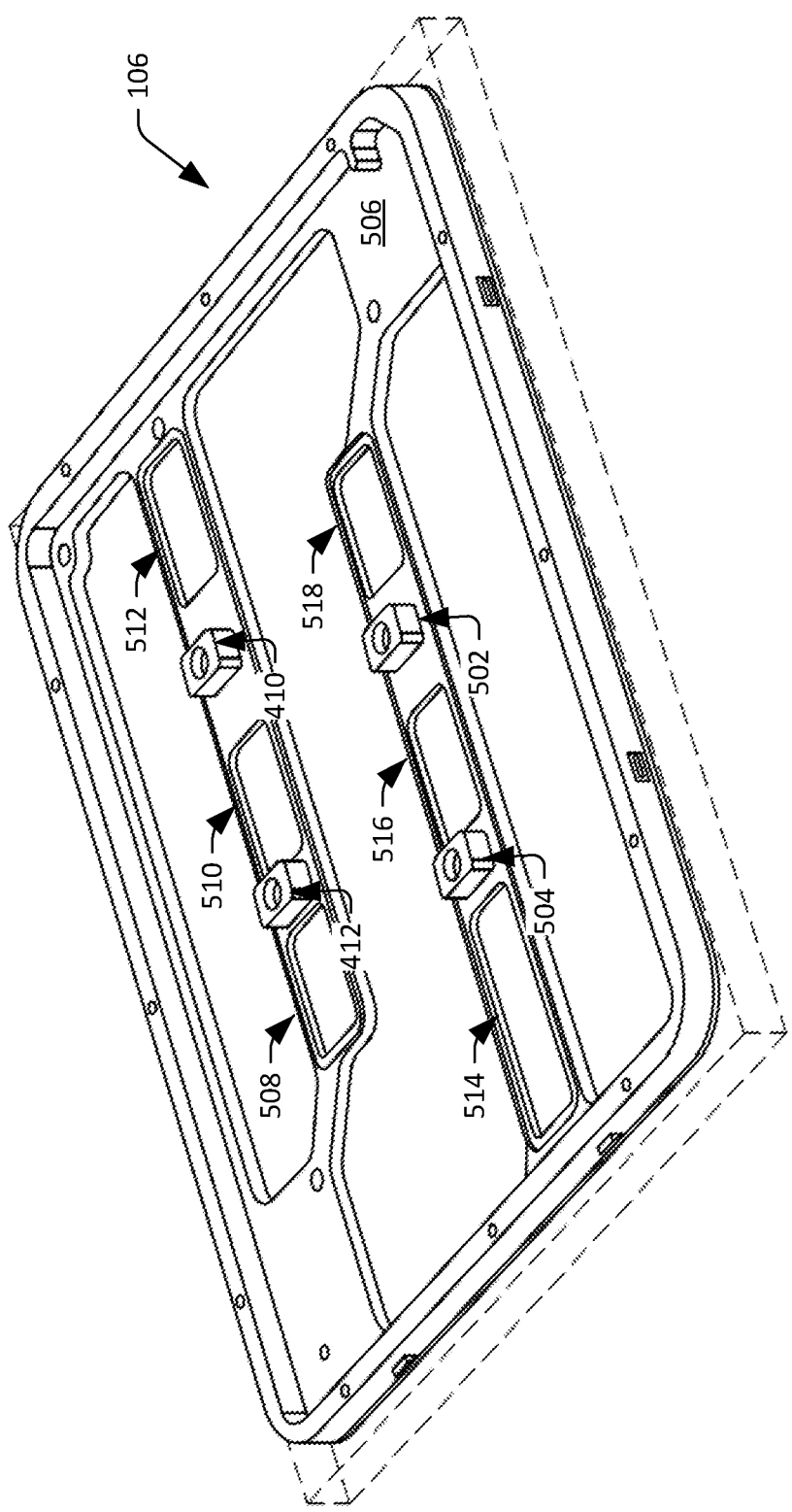
FIG. 5 is a view of an underside of a low-profile housing that is configured to dissipate heat generated by componentry of the radar system and is further configured to suppress undesired electromagnetic emissions from componentry of the radar system.

With reference now to FIG. 5, an isometric view of an underside of the low-profile housing 106 is illustrated. The housing 106 includes the heat stamps 410, 412, 502, and 504 that extend from a planar base 506 of the housing 106 away from a topside of the housing 106. The housing further includes recesses 508-518, wherein MMICs fit into the recesses when the housing 106 is set upon the PCB 204. In an example, multiple MMICs can fit into the recess 514. It is further noted that the heat stamps 410, 412, 502, and 504 are each positioned between a respective pair of recesses and are thus positioned between MMICs when the housing 106 is set upon the PCB 204.

Figure 6:
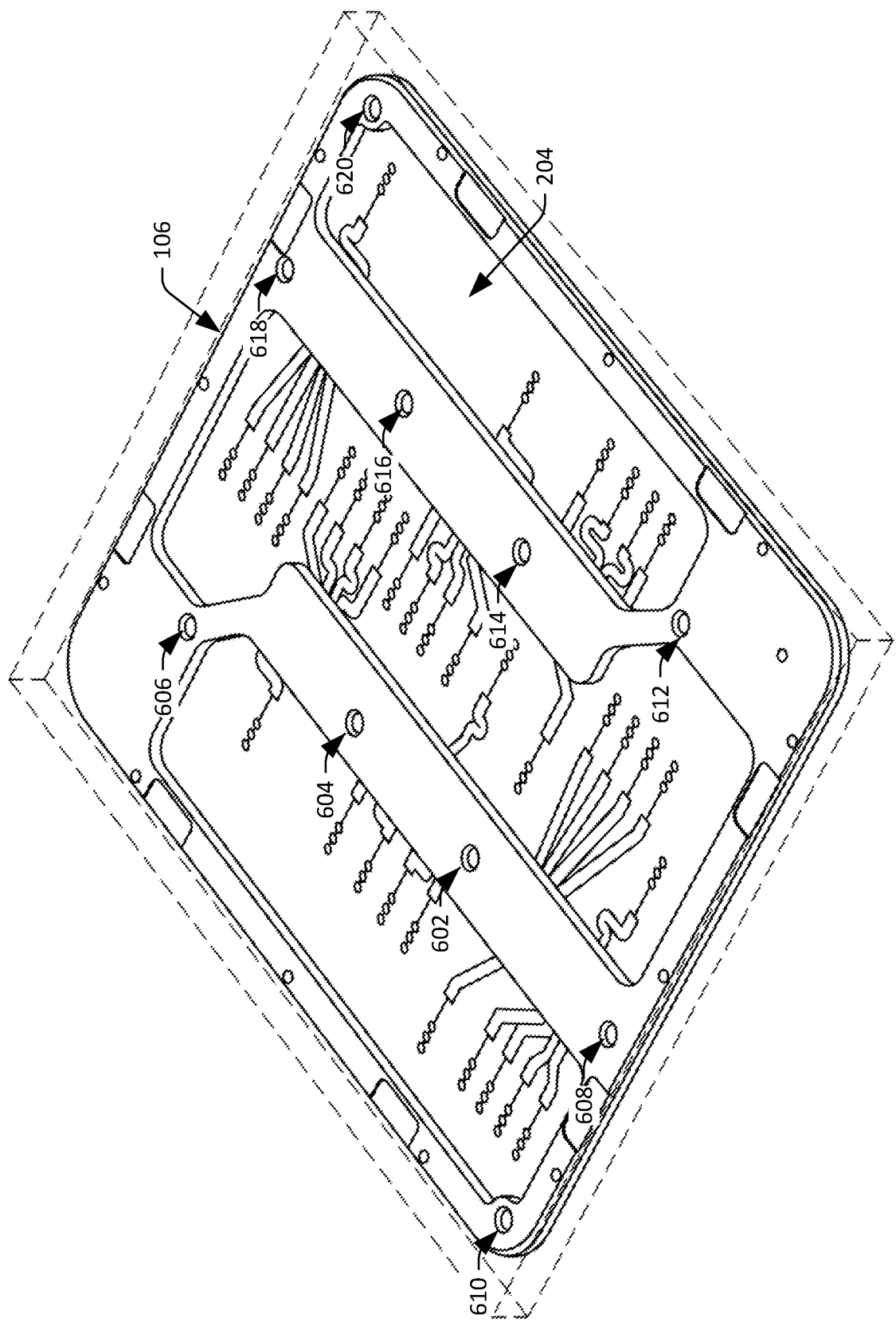
FIG. 6 is an isometric view of the low-profile housing (mask) mounted on a topside of the PCB.

Turning now to FIG. 6, an overhead view of the housing 106 set upon the PCB 204 is depicted. The housing 106 can include apertures 602-620, where fasteners can be placed through the apertures 602-620 to secure the housing 106 to the heat spreader 408 (FIG. 4). As noted above, the fasteners may be threaded screws, dowels, and/or the like. In addition, as mentioned previously, a radome can be fastened to the housing 106 by way of the apertures 602-620 and corresponding fasteners. FIG. 6 illustrates that the housing 106 simultaneously performs functions of heat dissipation and suppression of electromagnetic interference by encapsulating MMICs mounted on the PCB 204.

Figure 7:
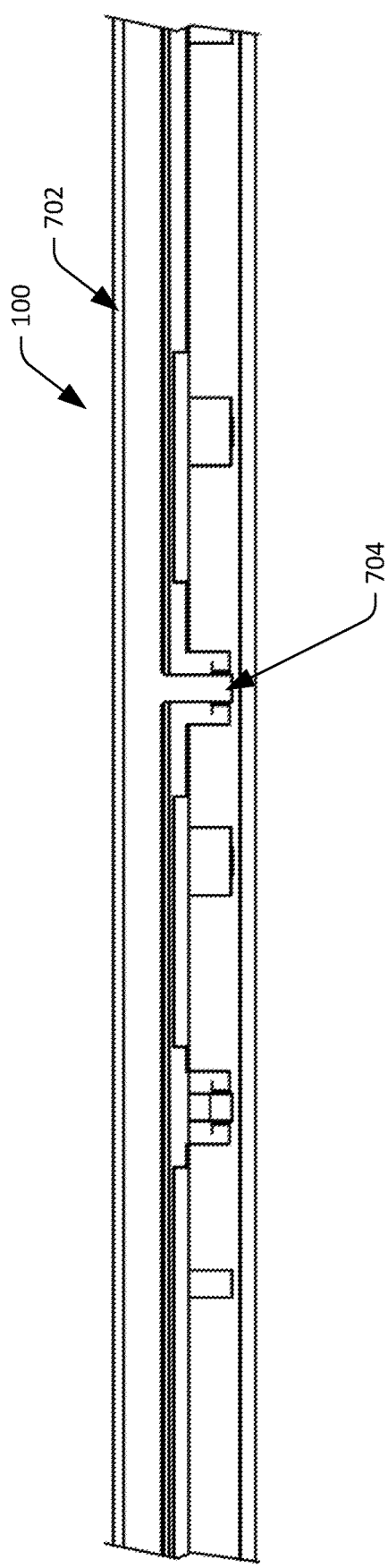
FIG. 7 is a cutaway view illustrating coupling of a radome to the low-profile housing.

FIG. 7 is a cross-sectional view of a portion of the radar system 100, where a radome 702 is coupled to the housing 106 by way of dowels that extend through apertures of the housing 106. Heat is transferred from the housing 106 to the heat spreader 408 by way the dowels. FIG. 7 depicts a dowel 704 extending from the radome 702 through an aperture, where the aperture extends through a heat stamp of the housing 106.

Figure 8:
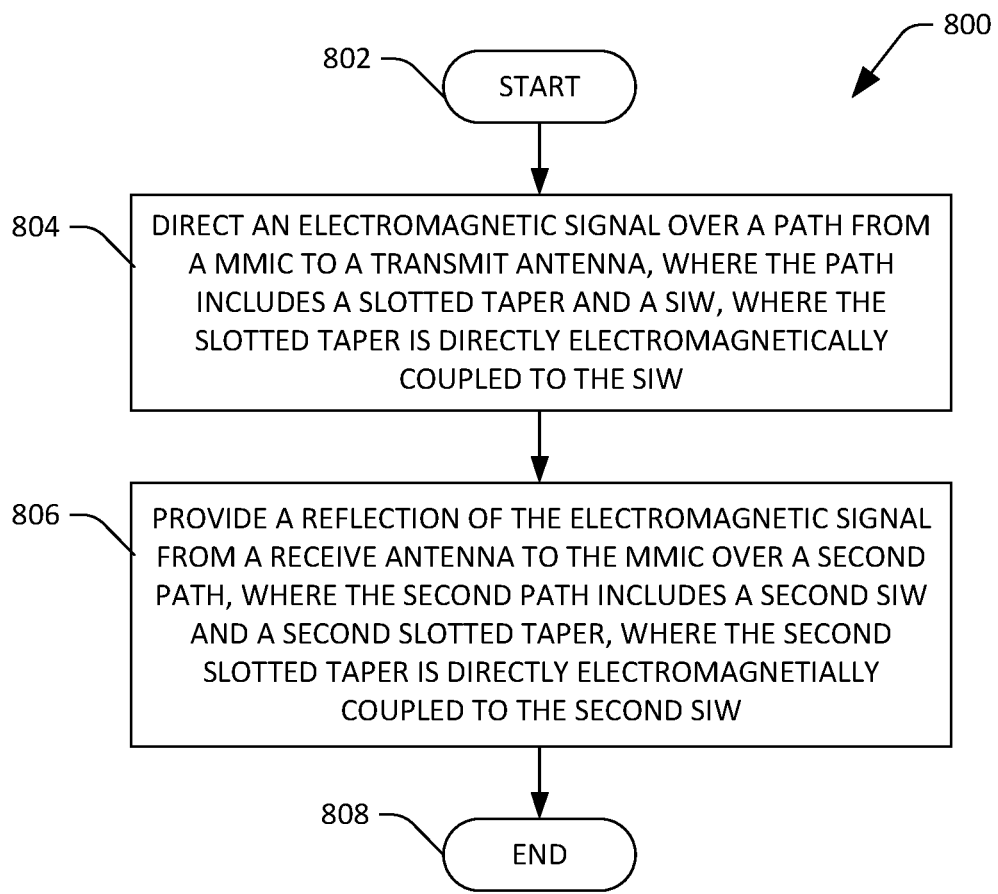
FIG. 8 is a flow diagram that illustrates a methodology for transmitting an electromagnetic signal from the radar system depicted in FIG. 1.
Figure 9:
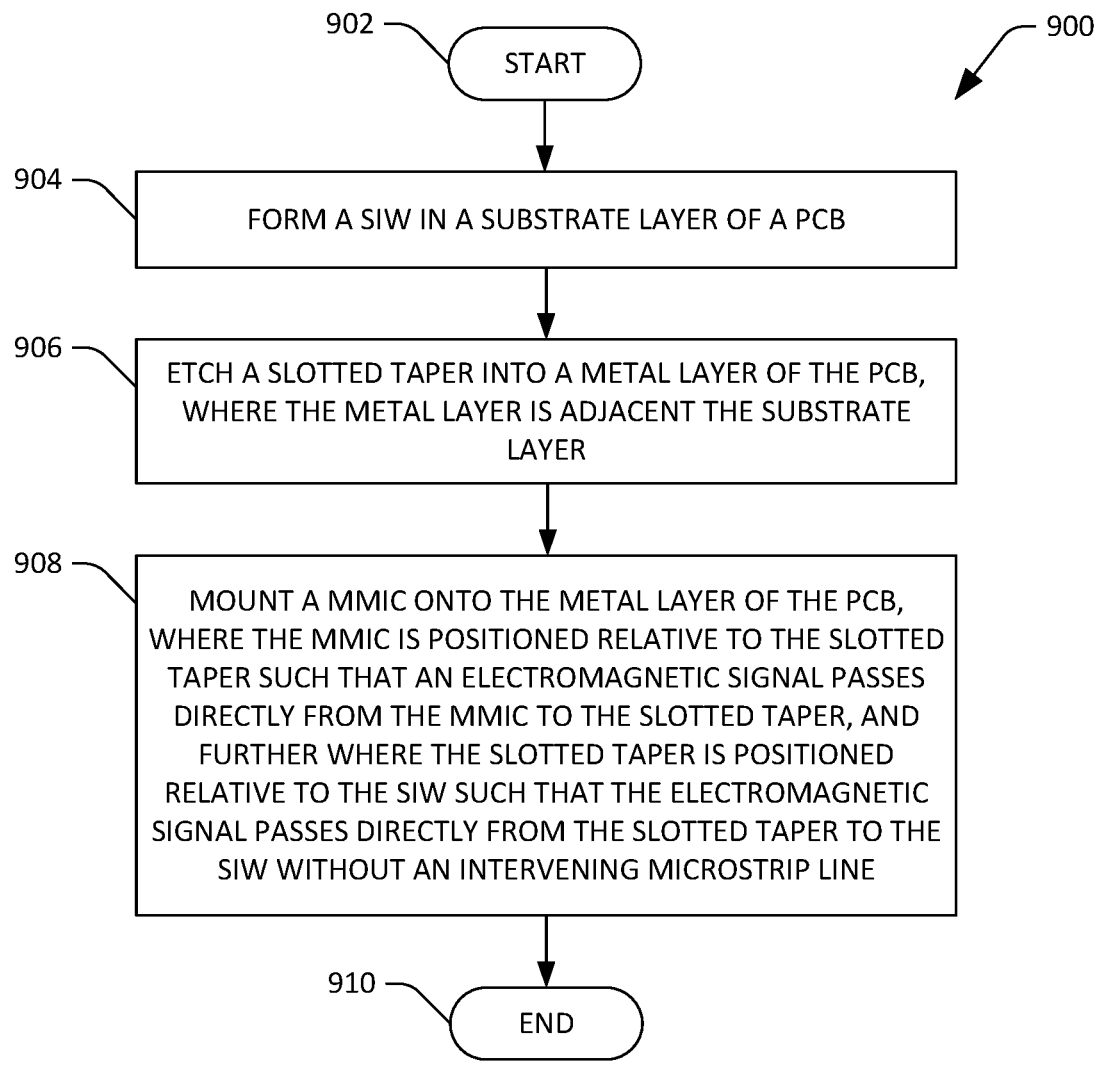
FIG. 9 is a flow diagram that illustrates a methodology for manufacturing the radar system depicted in FIG. 1.

Referring to FIGS. 8 and 9, methodologies pertaining to the radar system 100 are illustrated. While the methodologies are shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement the methodology described herein.

Moreover, some of the acts described herein may be computer-executable instructions that can be implemented by one or more processors and/or stored on a computer-readable medium or media. The computer-executable instructions can include a routine, a sub-routine, programs, a thread of execution, and/or the like. Still further, results of acts of the methodologies can be stored in a computer-readable medium, displayed on a display device, and/or the like.

Referring solely to FIG. 8, a methodology 800 performed by the radar system 100 in connection with detecting objects in a scene is illustrated. The methodology 800 starts at 802, and at 804, a Tx antenna is driven with an electromagnetic signal such that the Tx antenna radiates the electromagnetic signal into an environment of the radar system, where driving the Tx antenna with the electromagnetic signal includes directing the electromagnetic signal over a path from a MMIC to the TX antenna. The path includes a slotted taper that is etched into a metal layer of a PCB, where the MMIC is mounted to the metal layer of the PCB, and further wherein the electromagnetic signal passes from the MMIC to the slotted taper. The path additionally includes a SIW that is integrated into a substrate layer of the PCB, where the substrate layer is adjacent to the metal layer, and further wherein the electromagnetic signal passes directly from the slotted taper to the SIW without an intervening microstrip line.

At 806, a reflection of the electromagnetic signal is provided to the MMIC from an Rx antenna. The reflection travels a path from the Rx antenna to the MMIC, where the path includes a second SIW and a second slotted taper, where the reflection travels directly from the second SIW to the second slotted taper without an intervening microstrip line. The reflection passes from the slotted taper to the MMIC. An object in the scene can be detected based upon the reflection received by the MMIC. The methodology 800 completes at 808.

Now referring to FIG. 9, a methodology 900 for producing the radar system 100 is illustrated. The methodology 900 starts at 902, and at 904 an SIW is formed in a substrate layer of a PCB. At 906, a slotted taper is etched into a metal layer of the PCB, where the metal layer is adjacent the substrate layer in the PCB. At 908, a MM IC is mounted onto the metal layer of the PCB, where the MM IC is positioned relative to the slotted taper such that an electromagnetic signal generated by the MMIC passes directly from the MMIC to the slotted taper, and further where the MMIC is positioned relative to the SIW such that the electromagnetic signal passes directly from the slotted taper to the SIW without an intervening microstrip line. The methodology 900 completes at 910.

The features described herein relate to a multi-dimensional scanning radar system according to at least the examples provided below.

(A1) In one aspect, some embodiments include a two-dimensional scanning radar system that includes a PCB, where the PCB includes a metal layer and a substrate layer that is adjacent the metal layer. The scanning radar system also includes a plurality of monolithic microwave integrated circuits (MMICs) that are mounted on the metal layer of the PCB. The scanning radar system further includes a plurality of Tx antennas, wherein each MMIC in the plurality of MMICs is configured to drive at least one Tx antenna, wherein the MMIC is electromagnetically coupled to a Tx antenna by way of: 1) a slotted taper etched into the metal layer of the PCB; and 2) a substrate integrated waveguide (SIW) in the substrate layer of the PCB that is directly coupled to the tapered slot such that an electromagnetic signal generated by the MMIC passes from the MMIC to the slotted taper and from the slotted taper to the SIW.

(A2) In some embodiments of the scanning radar system of (A1), the metal layer is formed of copper.

(A3) In some embodiments of the scanning radar system of at least one of (A1)-(A2), there are between four and ten MMICs mounted on the metal layer of the PCB.

(A4) In some embodiments of the scanning radar system of at least one of (A1)-(A3), the scanning radar system further includes a plurality of Rx antennas, wherein each MMIC in the plurality of MMICs is configured to receive electromagnetic radiation detected by at least one Rx antenna, wherein the MMIC is electromagnetically coupled to a Rx antenna by way of: 1) a second SIW in the substrate layer that receives the electromagnetic radiation detected in the environment by the Rx antenna; and 2) a second slotted taper etched into the metal layer of the PCB that receives the electromagnetic radiation directly from the second SIW, wherein the MMIC receives the electromagnetic radiation from the second slotted taper.

(A5) In some embodiments of the scanning radar system of at least one of (A1)-(A4), the plurality of Rx antennas are electromagnetically coupled to the MMIC, and further wherein the Tx antenna is the only transmit antenna that is electromagnetically coupled to the MMIC.

(A6) In some embodiments of the scanning radar system of at least one of (A1)-(A5), the PCB includes a ground layer that is adjacent to the substrate layer; and a pair of vias that extend through the substrate layer to the ground layer, wherein the pair of vias are metallized, and further wherein the pair of metallized vias are configured to facilitate matching an impedance of the slotted taper with an impedance of the SIW.

(A7) In some embodiments of the scanning radar system of at least one of (A1)-(A6), the pair of metallized vias are further configured to cause out-of-band interfering signals to be filtered.

(A8) In some embodiments of the scanning radar system of at least one of (A1)-(A7), the pair of vias are located within the SIW.

(A9) In some embodiments of the scanning radar system of at least one of (A1)-(A8), the scanning radar system further includes a housing that is thermally coupled to MMICs by way of a thermally conductive material, wherein the housing is configured to distribute heat evenly across the MMICs.

(A10) In some embodiments of the scanning radar system of at least one of (A1)-(A9), the MMICs are placed on a first side of the PCB, wherein the radar system further includes a heat spreader that is positioned on a second side of the PCB that opposes the first side, wherein the PCB has a cutout that extends therethrough, and further wherein the housing is coupled to the heat spreader by way of the cutout.

(A11) In some embodiments of the scanning radar system of at least one of (A1)-(A10), the cutout is positioned between two MMICs in the plurality of MMICs.

(A12) In some embodiments of the scanning radar system of at least one of (A1)-(A11), the housing is further configured to suppress electromagnetic radiation emitted by the MMICs on the PCB.

(B1) In another aspect, some embodiments include a method, where the method includes driving a Tx antenna with an electromagnetic signal such that the Tx antenna radiates the electromagnetic signal into an environment of a radar system. Driving the Tx antenna with the electromagnetic signal includes directing electromagnetic signal over a path from a monolithic microwave integrated circuit (MMIC) to the Tx antenna, where the path includes: 1) a slotted taper that is etched into a metal layer of a printed circuit board (PCB), wherein the MMIC is mounted on the PCB, and further wherein the electromagnetic signal passes from the MMIC to the tapered slot; and 2) a substrate integrated waveguide (SIW) that is integrated into a substrate layer of the PCB, wherein the substrate layer is adjacent to the metal layer, and further wherein the electromagnetic signal passes directly from the slotted taper to the SIW without an intervening microstrip line.

(B2) In some embodiments of the method of (B1), the method also includes providing a reflection of the electromagnetic signal from an Rx antenna to the MMIC over a second path, where the second path includes: (1) a second SIW that is integrated into the substrate layer of the PCB, wherein the reflection passes from the Rx antenna to the second SIW; and (2) a second tapered slot that is etched into the metal layer of the PCB, wherein the reflection passes directly from the second SIW to the second tapered slot without an intervening microstrip line, and further wherein the electromagnetic signal passes from the second tapered slot to the MMIC.

(B3) In some embodiments of at least one of the methods of (B1)-(B2), the method further includes dissipating heat emitted by the MMIC by way of a metallic housing that is thermally coupled to the MMIC by way of a thermally conductive material.

(B4) In some embodiments of at least one of the methods of (B1)-(B3), the housing includes a heat stamp, and further wherein the heat is further dissipated by way of the heat stamp that extends through the substrate layer of the PCB to a heat spreader that is positioned on a backside of the PCB.

(B5) In some embodiments of at least one of the methods of (B1)-(B4), a metallized via extends from the substrate layer of the PCB to a ground layer that is adjacent the substrate layer and opposite the metal layer, and the method further includes matching impedance of the tapered slot with impedance of the SIW by way of the metallized via.

(B6) In some embodiments of at least one of the methods of (B1)-(B6), the metalized via is included in the SIW to facilitate improved transfer and filtering.

(C1) In another aspect, a method for manufacturing a two-dimensional scanning radar system includes forming a substrate integrated waveguide (SIW) into a substrate layer of a printed circuit board (PCB). The method also includes etching a slotted taper into a metallized layer of the PCB, wherein the metallized layer is adjacent the substrate layer. The method additionally includes mounting a monolithic microwave integrated circuit (MMIC) onto the metallized layer of the PCB, where the MMIC is positioned relative to the slotted taper such that an electromagnetic signal passes from the MMIC to the slotted taper, and further where the slotted taper is positioned relative to the SIW such that the electromagnetic signal passes directly from the slotted taper to the SIW without an intervening microstrip line.

(C2) In some embodiments of the method of (C1), the method also includes thermally coupling a metallized housing to the MMIC by way of a thermally conductive material; and thermally coupling the metallized housing to a heat spreader by way of heat stamps that extend from the metalized housing through the substrate layer of the PCB.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A two-dimensional scanning radar system comprising:
a printed circuit board (PCB) comprising:
a metal layer;
a substrate layer that is adjacent the metal layer;
a plurality of monolithic microwave integrated circuits (MMICs) that are mounted on the metal layer of the PCB; and a plurality of Tx antennas, wherein each MMIC in the plurality of MMICs is configured to drive at least one Tx antenna, wherein the MMIC is electromagnetically coupled to a Tx antenna by way of:
- a slotted taper etched into the metal layer of the PCB; and
- a substrate integrated waveguide (SIW) in the substrate layer of the PCB that is directly coupled to the tapered slot such that an electromagnetic signal generated by the MIMIC passes from the MIMIC to the slotted taper and from the slotted taper to the SIW.

2. The radar system of claim 1, wherein the metal layer is formed of copper.

3. The radar system of claim 1, wherein there are between four and ten MMICs mounted on the metal layer of the PCB.

4. The radar system of claim 1, further comprising a plurality of Rx antennas, wherein each MIMIC in the plurality of MMICs is configured to receive electromagnetic radiation detected by at least one Rx antenna, wherein the MMIC is electromagnetically coupled to a Rx antenna by way of:
- a second SIW in the substrate layer that receives the electromagnetic radiation detected in the environment by the Rx antenna; and
- a second slotted taper etched into the metal layer of the PCB that receives the electromagnetic radiation directly from the second SIW, wherein the MMIC receives the electromagnetic radiation from the second slotted taper.

5. The radar system of claim 4, wherein the plurality of Rx antennas are electromagnetically coupled to the MMIC, and further wherein the Tx antenna is the only transmit antenna that is electromagnetically coupled to the MIMIC.

6. The radar system of claim 1, wherein the PCB comprises:
- a ground layer that is adjacent to the substrate layer; and
- a pair of vias that extend through the substrate layer to the ground layer, wherein the pair of vias are metallized, and further wherein the pair of metallized vias are configured to facilitate matching an impedance of the slotted taper with an impedance of the SIW.

7. The radar system of claim 6, wherein the pair of metallized vias are further configured to cause out-of-band interfering signals to be filtered.

8. The radar system of claim 6, wherein the pair of vias are located within the SIW.

9. The radar system of claim 1, further comprising a housing that is thermally coupled to MMICs by way of a thermally conductive material, wherein the housing is configured to distribute heat evenly across the MMICs.

10. The radar system of claim 9, wherein the MMICs are placed on a first side of the PCB, wherein the radar system further comprising a heat spreader that is positioned on a second side of the PCB that opposes the first side, wherein the PCB has a cutout that extends therethrough, and further wherein the housing is coupled to the heat spreader by way of the cutout.

11. The radar system of claim 10, wherein the cutout is positioned between two MMICs in the plurality of MMICs.

12. The radar system of claim 9, wherein the housing is further configured to suppress electromagnetic radiation emitted by the MMICs on the PCB.

13. A method comprising:
driving a Tx antenna with an electromagnetic signal such that the Tx antenna radiates the electromagnetic signal into an environment of a radar system, wherein driving the Tx antenna with the electromagnetic signal comprises:
directing the electromagnetic signal over a path from a monolithic microwave integrated circuit (MIMIC) to the Tx antenna, wherein the path comprises:
- a slotted taper that is etched into a metal layer of a printed circuit board (PCB), wherein the MMIC is mounted on the PCB, and further wherein the electromagnetic signal passes from the MMIC to the tapered slot; and
- a substrate integrated waveguide (SIW) that is integrated into a substrate layer of the PCB, wherein the substrate layer is adjacent to the metal layer, and further wherein the electromagnetic signal passes directly from the slotted taper to the SIW without an intervening microstrip line.

14. The method of claim 13, further comprising:
providing a reflection of the electromagnetic signal from an Rx antenna to the MMIC over a second path, wherein the second path comprises:
a second SIW that is integrated into the substrate layer of the PCB, wherein the reflection passes from the Rx antenna to the second SIW; and
a second tapered slot that is etched into the metal layer of the PCB, wherein the reflection passes directly from the second SIW to the second tapered slot without an intervening microstrip line, and further wherein the electromagnetic signal passes from the second tapered slot to the MMIC.

15. The method of claim 13, further comprising:
dissipating heat emitted by the MMIC by way of a metallic housing that is thermally coupled to the MMIC by way of a thermally conductive material.

16. The method of claim 15, wherein the housing includes a heat stamp, and further wherein the heat is further dissipated by way of the heat stamp that extends through the substrate layer of the PCB to a heat spreader that is positioned on a backside of the PCB.

17. The method of claim 13, wherein a metallized via extends from the substrate layer of the PCB to a ground layer that is adjacent the substrate layer and opposite the metal layer, the method further comprising:
matching impedance of the tapered slot with impedance of the SIW by way of the metallized via.

18. The method of claim 13, wherein the metalized via is included in the SIW to facilitate improved transfer and filtering.

19. A method for manufacturing a two-dimensional scanning radar system, the method comprising:
forming a substrate integrated waveguide (SIW) into a substrate layer of a printed circuit board (PCB);
etching a slotted taper into a metallized layer of the PCB, wherein the metallized layer is adjacent the substrate layer; and
mounting a monolithic microwave integrated circuit (MIMIC) onto the metallized layer of the PCB, wherein the MMIC is positioned relative to the slotted taper such that an electromagnetic signal passes from the MMIC to the slotted taper, and further wherein the slotted taper is positioned relative to the SIW such that the electromagnetic signal passes directly from the slotted taper to the SIW without an intervening microstrip line.

20. The method of claim 19, further comprising:
thermally coupling a metallized housing to the MIMIC by way of a thermally conductive material; and thermally coupling the metallized housing to a heat spreader by way of heat stamps that extend from the metalized housing through the substrate layer of the PCB.

\* \* \* \* \*